United States Patent [19]

Hulkko

[11] Patent Number: 4,998,078
[45] Date of Patent: Mar. 5, 1991

[54] DIVIDING CASCADE NETWORK FOR A SUPPORT STATION IN A RADIO TELEPHONE NETWORK

[75] Inventor: Jaakko Hulkko, Oulu, Finland

[73] Assignee: Nokia-Mobira Oy, Salo, Finland

[21] Appl. No.: 336,259

[22] Filed: Apr. 11, 1989

[30] Foreign Application Priority Data

Apr. 18, 1988 [FI] Finland .................................. 881813

[51] Int. Cl.$^5$ .............................................. H01P 5/18
[52] U.S. Cl. ..................................... 333/109; 333/111
[58] Field of Search ............... 333/109, 110, 113, 115, 333/116, 111, 112

[56] References Cited

U.S. PATENT DOCUMENTS 2,775,740  12/1956  Oliver ................................. 333/115
3,372,350   3/1968  Kawahashi et al. ............ 333/110 X
3,619,504  11/1971  De Veer et al. ................ 333/109 X Primary Examiner—Paul Gensler
Attorney, Agent, or Firm—Darby & Darby

[57] ABSTRACT

The invention relates to a dividing network in the support station in a radio telephone network, wherein the received multi-channel antenna signal (ANT) is divided among separate receivers (CH1-CHn) by means of a dividing unit. The dividing unit is made up of a filter (2), an amplifier (3) and a dividing network (1). According to the invention it has, in a cascade (11; 21), N directional couplers (H1-Hn; B1-Bn), there being branched out from the cascade in succession to each of the N receivers (CH1-CHn) a share, according to the coupling (k1-kn) of the directional coupler, of the filtered and amplified antenna signal (4).

14 Claims, 3 Drawing Sheets $k1 < k2 < \cdots < ki < \cdots < kn; \quad kn = 0 dB$

DIVIDING CASCADE NETWORK FOR A SUPPORT STATION IN A RADIO TELEPHONE NETWORK

BACKGROUND OF THE INVENTION

The invention relates to a dividing network in the support station in a radio telephone network, wherein a received multi-channel antenna signal is divided among separate receivers by means of a dividing unit, the dividing unit consisting of a filter, an amplifier and a dividing network.

In radio telephone networks, and especially in cellular telephone systems, the support stations comprise a plurality of frequency channels, which may be time channeled and/or frequency channeled. Owing to limited antenna space and to cabling costs, the aim is to connect several parallel receivers and transmitters to the same antenna.

For example, when the capacity of a cellular telephone network is increased, the number of separate cells will increase, the radius of the cells will decrease, and the number of radio channels per one cell will increase. In such use it will be necessary to couple simultaneously a number of separate receivers/transmitters to one receiver/transmitter antenna in a multi-channel support station.

SUMMARY OF THE INVENTION

The term receiver or reception used hereinafter is to be understood as also meaning transmission or a transmitter.

A multi-channel reception can be implemented by using a so-called dividing unit. All of the connections of the dividing unit must be well matched within the entire reception band, and faults in individual receivers must not disturb the other receivers in operation. The dividing unit must be easy to extend and also small in size. FIG. 1 shows a typical prior-art block diagram of such a dividing network.

In this, the dividing unit is made up of a filter 2, an amplifier 3, and the actual dividing network 1 which divides the antenna signal. The multi-channel antenna signal ANT arrives, filtered and amplified, at the dividing network 1 at point 4.

The dividing network 1 is typically made up of several parallel passive dividers, dividing by two or the like; by means of these dividers the received signals are divided equally among the separate receivers, outputs CH1, CH2–CHn. For extension of the dividing network, one unused output EXT is often left in the network. FIG. 2 illustrates the structure of the dividing network in this prior-art system.

The problem involved in the dividing unit described is how to implement the dividing so that the result will be a small-sized system requiring little external cabling. The extension of the network may also involve problems, as may electrical deficiencies in it, such as weak output matchings and possibly limited isolation between the outputs.

The object of the invention is therefore to find a dividing network structure by means of which the disadvantages of prior-art technology are avoided and which also facilitates the manufacture of the equipment and the assembly planning and cabling of the system.

SUMMARY OF THE INVENTION

The problem has been solved according to the invention so that the dividing network has N directional couplers in a cascade branched out from the cascade successively, preferably via a respective attenuator, to each of N receivers a share, in accordance with the coupling of the directional coupler, of the filtered and amplified antenna signal. In the parallel divider case, the coupling factor increases towards the end of the cascade. Respectively, in the case of a dividing network in connection with a transmitter, it has, in a cascade, N directional couplers, there being coupled to this cascade from each of N transmitters a share, according to the coupling of the directional coupler, of the filtered and amplified antenna signal.

BRIEF DESCRIPTION OF THE DRAWINGS

The invention is described below in greater detail on the basis of embodiment examples and with reference to the accompanying drawing, in which

FIG. 3 depicts a cascade dividing network according to the invention, and one embodiment of it, as a block diagram. A filtered and amplified multi-channel antenna signal 4 is led to matched directional couplers H1–Hn, by means of which the signals coming to receivers CH1–CHn of the channel units are branched. The receivers are connected via controllable attenuators ATT1–ATTn. The cascade is terminated in an impedance I. In this embodiment the couplings k of the directional couplers are always equal. The optimal coupling k of the directional couplers is:

$$k_i = k_{opt} = 10 * \log_{10}(1/n) \, dB,$$

where $i = 1 \ldots n$, whereby the minimum attenuation is attained. Thus, in this case: $k_1 = k_2 = \ldots = k_i = k_n \, dB$. Since the coupling in each directional coupler is the same, the signal level is attenuated after each directional coupler so that, after the $i^{th}$ output, the level has been attenuated:

$$A_{(output \, i)} = 10*(i-1)*\log_{10}(1-10^{k/10}) + k \, dB$$

as compared with input 4. For this reason the signal level is different in each output of the dividing network. The different values of the output-specific attenuations, i.e. in practice the signal levels, can be compensated for either by means of controllable attenuators ATT1–ATTn or by taking into account, when measuring the strength differences of the field, the attenuation difference in the receivers coupled to the dividing unit.

Figure 1:
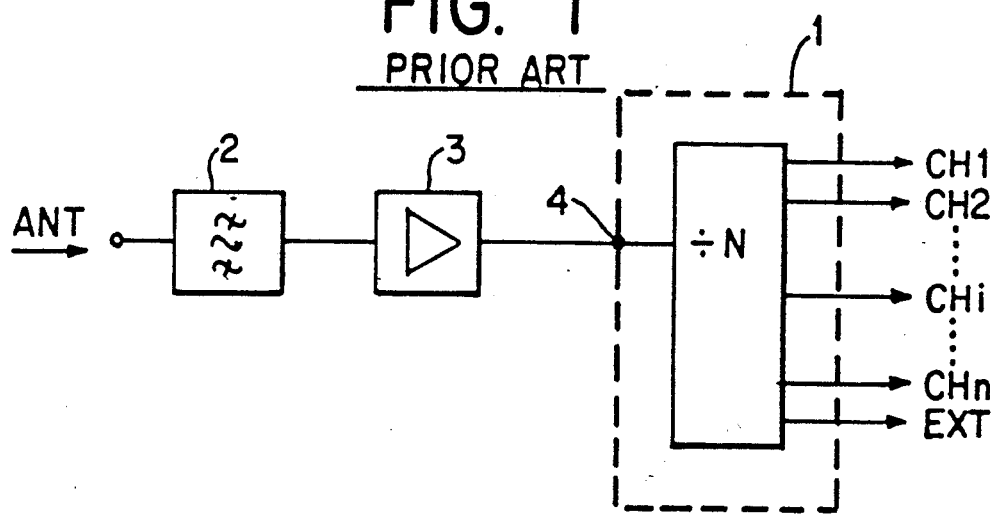
FIG. 1 is a block diagram of a prior-art dividing unit.
Figure 2:
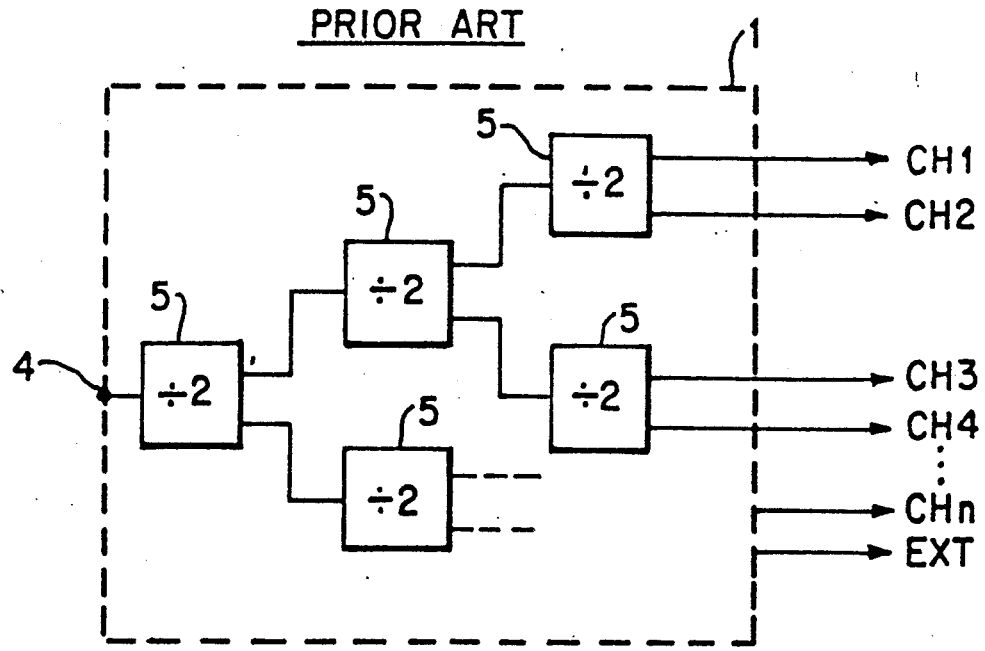
FIG. 2 depicts in greater detail the dividing network of the dividing unit of FIG. 1.
Figure 3:
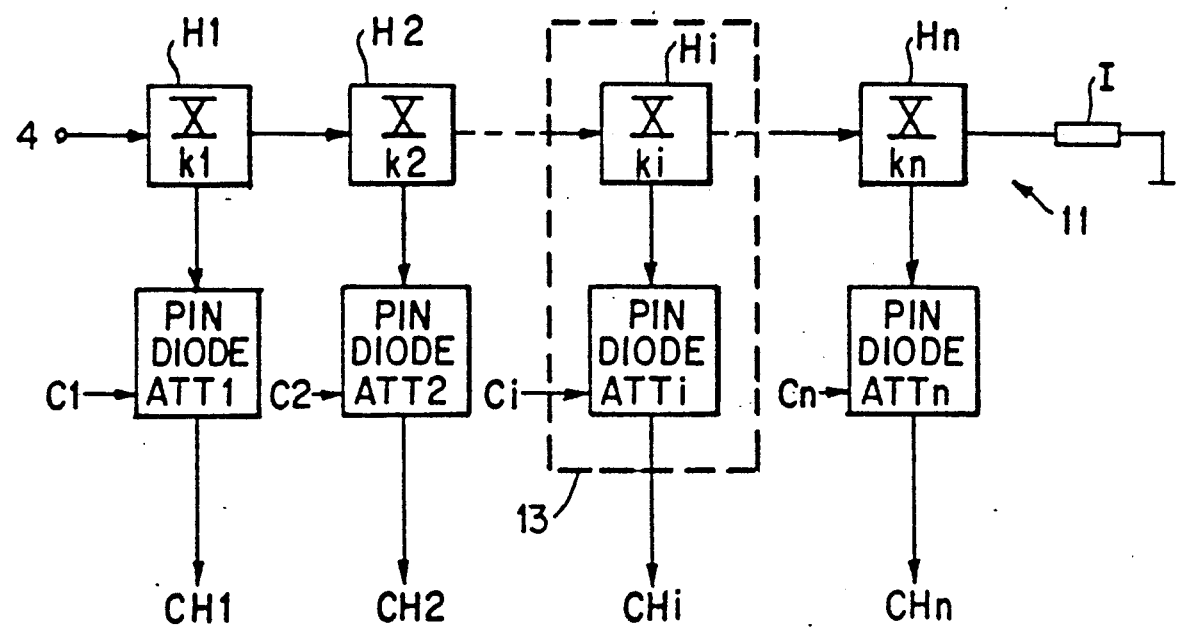
FIG. 3 is a block diagram of a cascade dividing network according to the invention, in which the couplings of the directional couplers are equal.

The supplementary attenuation required when using controllable attenuators can easily be measured automatically when the support station is in the so-called RF-loop state judged on the basis of the strength reading of the field. The control can be automated by using, for example, voltage-controlled PIN diode attenuators. In FIG. 3 the controls are indicated by reference numerals C1-Cn. The directional couplers H1-Hn of the dividing network 11 may be separate or be disposed directly in connection with the receivers inside the channel units, in which case it will be easy to attain a large electrical isolation between the directional couplers. In FIG. 3 this situation is illustrated by unit 13, which contains the possible attenuator ATT, and is located in connection with the channel unit. Since an actual separate dividing unit is in such a case no longer necessary, the overall structure will be small, inexpensive and simple. In addition, the cabling will be simple to plan and to implement.

In the case depicted in FIG. 3, it is easy, by means of directional couplers, to attain a great electrical isolation also for the reason that the coupling necessary is of a small magnitude. For example, in an 8-channel system it is −9 dB, and for example in a 64-channel system it is −18 dB. A supplementary isolation of over −20 dB is easily achieved using a balanced structure of the directional coupler.

Furthermore, the directional couplers H1-Hn are identical, in which case their design and implementation even in large production runs is inexpensive and precise.

Figure 3A:
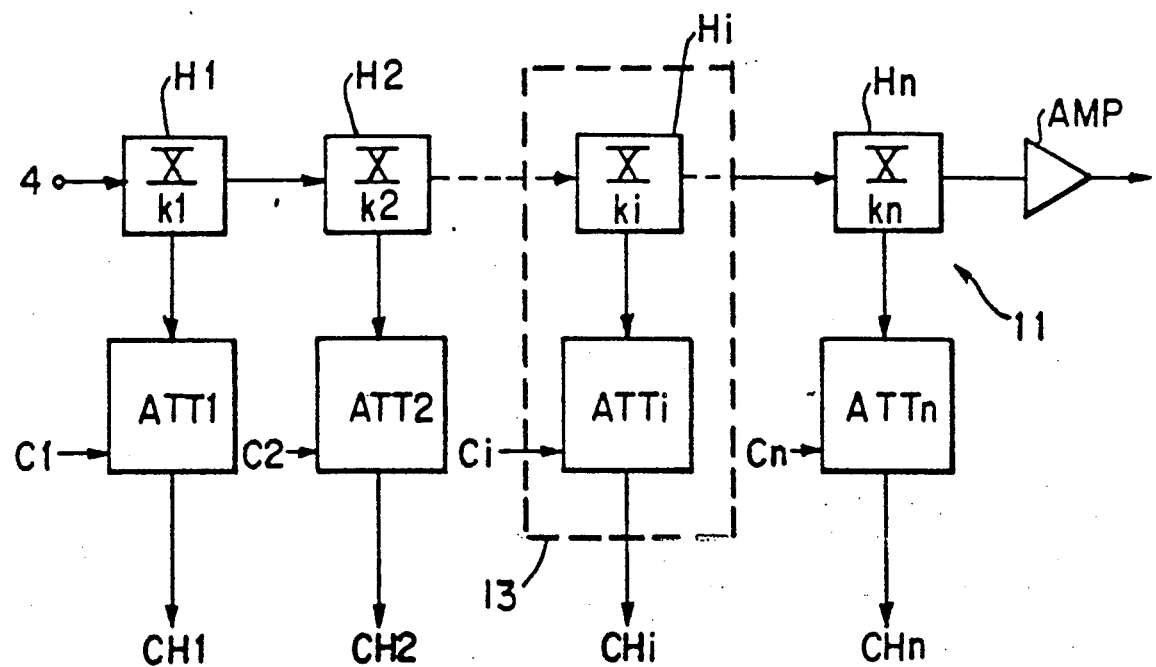
FIG. 3a is a block diagram as in FIG. 3, but showing an amplifier at the end of the cascade.

Further extension of a cascade dividing network 11 from the design length will be simple, since the attenuation from the input 4 of the dividing unit to the output is smaller than the attenuation from the input in question to the input of the channel units. The cascade can be continued by placing, an amplifier in the place of the terminal impedance I (see FIG. 3a). The increasing effect of the amplifier, which extends the cascade, on the overall noise level of the system is in such a case minimal (in the previous example 0.04 dB, if the noise level of the amplifier is 2 dB).

Figure 5:
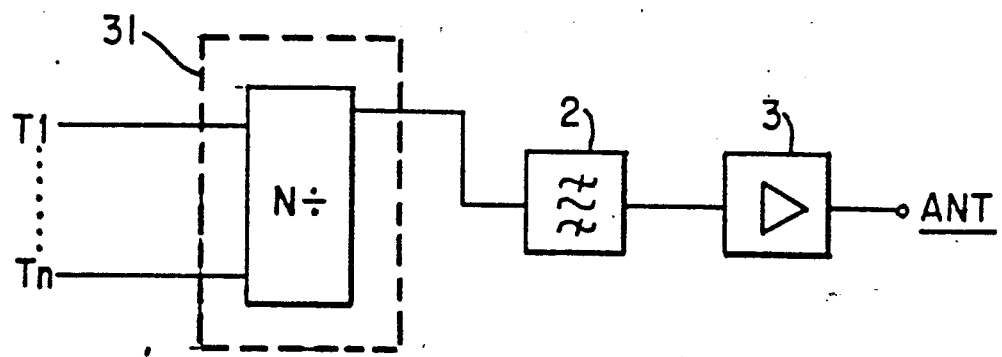
FIG. 5 depicts, in the form of a block diagram, the structure according to the invention, applied to a transmitter system.

The cascade dividing network 11 according to FIG. 3 can, of course, be applied for use also in connection with a transmitter or transmitters; this situation is depicted schematically in FIG. 5.

Figure 4:
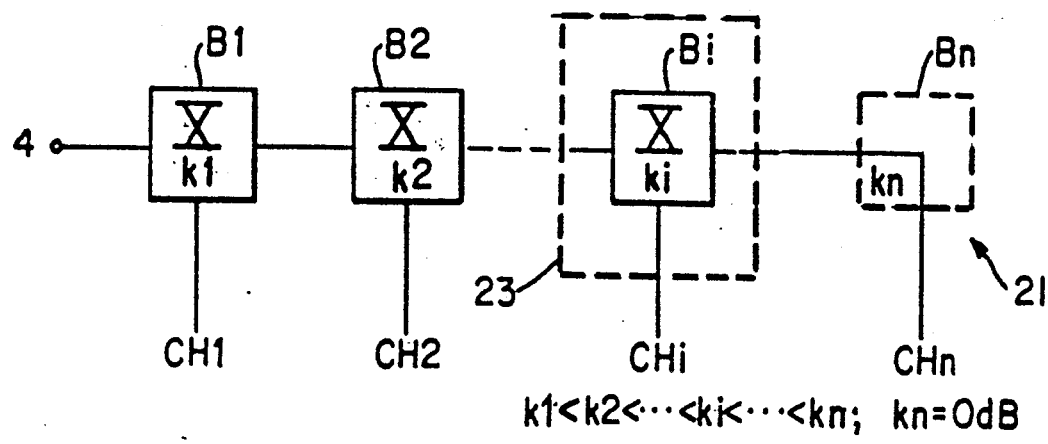
FIG. 4 depicts another embodiment of the cascade dividing network according to the invention, in which the couplings of the directional couplers are unequal.

The cascade dividing network according to the invention can also be implemented in a variable-coupling form. In this case the couplings of the directional couplers B1-Bn are not equal (FIG. 4). In such a case the coupling k grows stronger as the channel number increases, according to $$k_i = 10 * \log_{10}(1/(N-i+1)) dB$$

where i varies within the range 1−n. In this case $$k1 < k2 < \ldots < ki < \ldots < kn$$

is in force.

It can be seen from the above formula that, when i approaches the value n, the coupling becomes $kn = 0dB$, i.e. in a variable-coupling dividing network 21 dividing into n branches, only n−1 directional couplers are needed, and the $n_{th}$ directional coupler is replaced by direct coupling kn.

The special features of this second embodiment example include, not only the above-mentioned absence of the $n_{th}$ directional coupler, but also the fact that channel-specific controllable attenuators are not at all necessary. Also in this case the directional couplers can be implemented as separate couplers directly inside the channel units, which is indicated by unit 23, depicted be broken line. Also in this case a high electrical isolation can be simply achieved between the directional couplers. Likewise, the cabling in the construction of the support station can be implemented in a simple form.

Also in this case, the dividing network according to FIG. 4 can be used in connection with a transmitter, for example in block 31 (in FIG. 5).

The cascade dividing networks according to the invention can be used most advantageously in multi-channel diversity support stations having more than 16 channels. In this case, in accordance with the above, the dividing network can be implemented within the channel units CH1-CHn. The preferred embodiment provides for a very simple antenna cabling between the channels and for good possibilities for extending the dividing network. In its electrical properties the cascade dividing network is easier to implement in accordance with the requirements than is a dividing network in accordance with the state of the art.

FIG. 5 shows schematically the use of a dividing network according to the invention in a transmitter system. In it, signals coming from separate transmitters T1-Tn are fed to the dividing network 31, from which they are fed via the filter 2 to the amplifier 3 in order to be fed further as a multi-channel antenna signal to the antenna ANT. In the case of a transmitter, the dividing network can be implemented either in a constant-coupling or variable-coupling form in accordance with the embodiment examples described above. In practice, however, the dividing networks used in transmitter coupling are such that the carrier-wave specific power levels must remain low in order that the total power loss should not be high.

Although the dividing network according to the present invention has been described above only as applied to a radio telephone network, it is clear that it can also be applied in other corresponding cases.

Uses for the dividing network according to the present invention are found particularly at support stations of cellular telephone systems.

I claim:

1. A dividing unit comprising:
   means for filtering and amplifying a multi-channel signal to provide a filtered and amplified multi-channel signal;
   a plurality of receivers; and
   dividing network means for providing respective proportions of the filtered and amplified multi-channel signal to each of said receivers, said dividing network means including a plurality of directional couplers connected to each other successively in cascade and including a plurality of controllable attenuators respectively connected with and between said receivers and said directional couplers, said directional couplers each having respective coupling factors, said attenuators receiving said proportion of the filtered and amplified multi-channel signal in dependence upon said respective coupling factors of said directional couplers, said attenuators compensating for differences between said proportions and then providing compensated proportions to said receivers, respectively.

2. A dividing unit as in claim 1, wherein said directional couplers have the same coupling factor which is $10 \times \log_{10}(1/n)$ decibels where n is the number of said directional couplers present.

3. A dividing unit as in claim 1, and further comprising means for adjusting attenuations of said controllable attenuators.

4. A dividing unit as in claim 3, wherein said attenuators are voltage-controllable PIN diode attenuators.

5. A dividing unit comprising:
a plurality of transmitters for generating signals;
dividing network means including a plurality of directional couplers connected to each other successively in cascade and including a plurality of controllable attenuators respectively connected with and between said transmitters and said directional couplers, said attenuators compensating for differences between said signals from said transmitters to produce compensated signals, said dividing network means summing said compensated signals, to produce a multi-channel signal, each of said transmitters providing a share of the multi-channel signal in correspondence with coupling factors of said directional couplers; and
means for filtering and for amplifying said multi-channel signal to produce a filtered and amplified multi-channel signal.

6. A dividing unit as in claim 5, wherein said directional couplers have the same coupling factor which is $10 \times \log_{10}(1/n)$ decibels where n is a number of directional couplers present.

7. A dividing unit comprising:
means for filtering and amplifying a multi-channel signal to produce a filtered and amplified multi-channel signal;
a plurality of receivers; and
dividing network means for providing respective proportions of the filtered and amplified multi-channel signal to each of said receivers, said dividing network means including a plurality of directional couplers connected to each other successively in cascade, said directional couplers having coupling factors of different magnitude so that said coupling increases in magnitude towards an end of said cascade in accordance with a formula of $ki = 10*\log_{10}(1/(n-i+1))$ decibels where n is an integer which is the number of directional couplers present plus any direct coupling in lieu of a directional coupler at an end of the cascade, i is an integer from 1 to n, and ki is an ith one of said couplings in correspondence with a respective one of said directional couplers.

8. A dividing unit is claimed in claim 7, wherein said unit is part of a radio telephone support section and said multi-channel signal is a multi-channel antenna signal.

9. A dividing unit comprising:
a plurality of transmitters for supplying signals; and
dividing network means for forming a multi-channel signal by summation of said signals supplied by said transmitters, said dividing network means including a plurality of directional couplers connected to each other successively in cascade and each having a respective coupling factor, and said transmitters being connected, respectively, to said directional couplers to provide a share of the multi-channel signal in correspondence with the respective coupling factors of said directional couplers, said directional couplers having coupling factors of different magnitude so that said coupling increases in magnitude towards an end of said cascade in accordance with a formula of $ki = 10*\log_{10}(1/(n-i+1))$ decibels where n is a number of directional couplers present plus any direct coupling in lieu of a directional coupler at an end of the cascade, i is an integer from 1 to n, and ki is an ith one of said couplings in correspondence with a respective one of said directional couplers; and
means for filtering and for amplifying said multi-channel signal to produce a filtered and amplified multi-channel signal.

10. A dividing unit is claimed in claims 9, wherein said unit is part of a radio telephone support section and said multi-channel signal is a multi-channel antenna signal.

11. A dividing unit, comprising:
means for filtering and amplifying a multi-channel signal to produce a filtered and amplified multi-channel signal;
a plurality of receivers;
dividing network means for providing a share of the filtered and amplified multi-channel signal successively in a cascade to each of said receivers in correspondence with a plurality of directional couplers connected to each other successively in cascade; and
an amplifier at an end of said cascade.

12. A dividing unit is claimed in claim 11, wherein said unit is part of a radio telephone support section and said multi-channel signal is a multi-channel antenna signal.

13. A dividing unit, comprising:
a plurality of transmitters for supplying signals;
dividing network means for forming a multi-channel signal by summation of said signals supplied by said separate transmitters, said dividing network, means including a plurality of directional couplers, each directional coupler having a coupling factor, said directional couplers being connected to each other in a cascade successively with inputs from each of said transmitters so as to provide a share of the multi-channel signal in correspondence with the coupling factors of said directional couplers;
means for filtering and for amplifying said multi-channel signal to produce a filtered and amplified multi-channel signal; and
an amplifier at an end of said cascade.

14. A dividing unit is claimed in claims 13, wherein said unit is part of a radio telephone support section and said multi-channel signal is a multi-channel antenna signal.

* * * * *